(12) United States Patent
Morris, III et al.

(10) Patent No.: US 10,903,740 B2
(45) Date of Patent: Jan. 26, 2021

(54) CHARGE PUMP SYSTEMS, DEVICES, AND METHODS

(71) Applicant: wiSpry, Inc., Irvine, CA (US)

(72) Inventors: Arthur S. Morris, III, Lakewood, CO (US); Vincent Cheung, San Gabriel, CA (US); David Zimlich, Dana Point, CA (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 16/735,346

(22) Filed: Jan. 6, 2020

(65) Prior Publication Data

US 2020/0220455 A1    Jul. 9, 2020

Related U.S. Application Data

(63) Continuation of application No. 15/983,123, filed on May 18, 2018, now Pat. No. 10,530,247, which is a
(Continued)

(51) Int. Cl.
*H02M 3/07* (2006.01)
*B81B 7/04* (2006.01)
(Continued)

(52) U.S. Cl.
CPC .......... *H02M 3/07* (2013.01); *B81B 5/00* (2013.01); *B81B 7/008* (2013.01); *B81B 7/04* (2013.01);
(Continued)

(58) Field of Classification Search
CPC combination set(s) only.
See application file for complete search history.

(56) References Cited

U.S. PATENT DOCUMENTS

RE35,121 E     12/1995  Olivo et al.
5,602,794 A *   2/1997  Javanifard ............ G11C 5/145
                                                365/226
(Continued)

FOREIGN PATENT DOCUMENTS

KR       101464257 B1    11/2014
WO    WO 2012/095897 A1   7/2012
(Continued)

OTHER PUBLICATIONS

International Search Report and Written Opinion for Application No. PCT/US2018/000069 dated Jun. 12, 2018.
(Continued)

*Primary Examiner* — Adam D Houston
(74) *Attorney, Agent, or Firm* — Jenkins, Wilson, Taylor & Hunt, P.A.

(57) ABSTRACT

The present subject matter relates to charge pump devices, systems, and methods in which a first plurality of series-connected charge-pump stages is connected between a supply voltage node and a first circuit node, wherein the first plurality of charge-pump stages are operable to produce a first electrical charge at the first circuit node, the first electrical charge having a first polarity; and a second plurality of series-connected charge-pump stages is connected between the supply voltage node and a second circuit node, wherein the second plurality of charge-pump stages are operable to produce a second electrical charge at the second circuit node, the second electrical charge having a second polarity.

16 Claims, 6 Drawing Sheets

Related U.S. Application Data continuation of application No. PCT/US2018/000070, filed on Feb. 16, 2018.

(60) Provisional application No. 62/460,003, filed on Feb. 16, 2017.

(51) Int. Cl.
  G05F 3/20 (2006.01)
  B81B 5/00 (2006.01)
  B81B 7/00 (2006.01)
  H02M 1/00 (2006.01)

(52) U.S. Cl.
  CPC .......... *G05F 3/205* (2013.01); *B81B 2203/04* (2013.01); *B81B 2207/053* (2013.01); *H02M 2001/0003* (2013.01)

(56) References Cited

U.S. PATENT DOCUMENTS

| | | | |
|---|---|---|---|
| 5,635,776 A | 6/1997 | Imi | |
| 5,729,163 A * | 3/1998 | McCleary | H02M 3/07 327/104 |
| 5,943,226 A * | 8/1999 | Kim | H02M 3/073 363/60 |
| 6,037,622 A * | 3/2000 | Lin | G11C 5/145 257/299 |
| 6,107,864 A * | 8/2000 | Fukushima | H02M 3/073 327/536 |
| 6,130,572 A * | 10/2000 | Ghilardelli | H02M 3/073 327/534 |
| 6,222,351 B1 | 4/2001 | Fontanella et al. | |
| 6,278,315 B1 * | 8/2001 | Kim | G11C 16/30 327/536 |
| 6,359,501 B2 | 3/2002 | Lin et al. | |
| 6,418,040 B1 * | 7/2002 | Meng | F28D 5/00 307/109 |
| 6,434,028 B1 | 8/2002 | Takeuchi et al. | |
| 6,501,325 B1 * | 12/2002 | Meng | H02M 3/073 327/536 |
| 6,734,717 B2 * | 5/2004 | Min | H02M 3/073 327/536 |
| 7,023,260 B2 | 4/2006 | Thorp et al. | |
| 7,777,557 B2 * | 8/2010 | Yamahira | G11C 5/145 327/536 |
| 7,808,303 B2 * | 10/2010 | Yamahira | H02M 3/073 327/536 |
| 7,957,204 B1 * | 6/2011 | Wu | G11C 5/145 365/189.09 |
| 8,120,413 B2 * | 2/2012 | Li | H02M 3/073 327/536 |
| 9,019,764 B2 * | 4/2015 | Lee | G11C 16/10 365/185.11 |
| 9,047,782 B1 | 6/2015 | Lee | |
| 9,431,201 B2 | 8/2016 | Nguyen et al. | |
| 9,634,562 B1 * | 4/2017 | Rana | H02M 3/073 |
| 10,396,815 B1 * | 8/2019 | Kuttner | H03F 3/2176 |
| 10,530,247 B2 * | 1/2020 | Morris, III | H02M 3/07 |
| 10,608,528 B2 | 3/2020 | Zimlich et al. | |
| 10,658,926 B2 | 5/2020 | DeReus et al. | |
| 2002/0101744 A1 * | 8/2002 | DeMone | H02M 3/073 363/59 |
| 2007/0096796 A1 * | 5/2007 | Firmansyah | H02M 3/07 327/536 |
| 2008/0169864 A1 * | 7/2008 | Yamahira | H02M 3/073 327/536 |
| 2008/0186081 A1 * | 8/2008 | Yamahira | H02M 3/073 327/536 |
| 2009/0174441 A1 | 7/2009 | Gebara et al. | |
| 2010/0237929 A1 | 9/2010 | Ikehashi | |
| 2011/0148509 A1 | 6/2011 | Pan | |
| 2011/0156803 A1 * | 6/2011 | Yap | H02M 3/073 327/536 |
| 2013/0176786 A1 * | 7/2013 | Jeon | G11C 16/0433 365/185.13 |
| 2013/0187707 A1 | 7/2013 | Tran et al. | |
| 2013/0321069 A1 | 12/2013 | Yajima et al. | |
| 2014/0022007 A1 * | 1/2014 | Sheng | G05F 3/02 327/536 |
| 2014/0285254 A1 | 9/2014 | Good et al. | |
| 2014/0340140 A1 * | 11/2014 | Siragusa | H02M 3/073 327/536 |
| 2015/0015323 A1 * | 1/2015 | Rahman | H02M 3/073 327/536 |
| 2015/0316586 A1 * | 11/2015 | Hammerschmidt | G01D 3/036 324/99 R |
| 2015/0333718 A1 * | 11/2015 | Lemkin | H03G 3/20 455/234.1 |
| 2015/0381036 A1 | 12/2015 | Watanabe et al. | |
| 2016/0285363 A1 * | 9/2016 | Englekirk | H02M 3/07 |
| 2016/0381455 A1 * | 12/2016 | Zeleznik | H04R 29/006 381/113 |
| 2018/0314284 A1 * | 11/2018 | Morris, III | G05F 3/205 |
| 2018/0337595 A1 * | 11/2018 | Morris, III | B81B 5/00 |
| 2019/0190375 A1 * | 6/2019 | Piccardi | H02M 3/073 |
| 2019/0229614 A1 * | 7/2019 | Mikhael | H03F 3/45269 |
| 2019/0267894 A1 | 8/2019 | DeReus et al. | |
| 2020/0228004 A1 | 7/2020 | Zimlich et al. | |

FOREIGN PATENT DOCUMENTS

| | | |
|---|---|---|
| WO | WO 2018/151853 A1 | 8/2018 |
| WO | WO 2018/151854 A1 | 8/2018 |

OTHER PUBLICATIONS

International Search Report and Written Opinion for Application No. PCT/US2018/000070 dated June 25, 2018.
Restriction Requirement for U.S. Appl. No. 15/940,458 dated Aug. 27, 2018.
Non-Final Office Action for U.S. Appl. No. 15/940,458 dated Jan. 30, 2019.
Interview Summary for U.S. Appl. No. 15/940,458 dated Apr. 8, 2019.
Final Office Action for U.S. Appl. No. 15/940,458 dated May 3, 2019.
Interview Summary for U.S. Appl. No. 15/940,458 dated Jun. 7, 2019.
Notice of Allowance for U.S. Appl. No. 15/983,123 dated Jun. 19, 2019.
Ex Parte Quayle Action for U.S. Appl. No. 15/940,458 dated Aug. 29, 2019.
Non-Final Office Action for U.S. Appl. No. 16/287,857 dated Aug. 29, 2019.
Notice of Allowance for U.S. Appl. No. 15/940,458 dated Nov. 19, 2019.
Notice of Allowance for U.S. Appl. No. 16/287,857 dated Jan. 8, 2020.
Casanova et al., "Design of a Step-up 400mW@40V Charge-Pump for Microrobotics Applications in a 100V-0.7[mu]m Intelligent interface Technology", Industrial Electronic, 2004 IEEE International Symposium on Industrial Electronics, Ajaccio, France, vol. 2, pp. 1227-1229 (2004).
European Search Report for Application No. 18754059.6 dated Jul. 8, 2020.
Non-Final Office Action for U.S. Appl. No. 16/836,049 dated Aug. 5, 2020.
Chinese Office Action for Application No. 201880012099.3 dated Oct. 10, 2020.
European Search Report for Application No. 18753968.9 dated Oct. 30, 2020.
Final Office Action for U.S. Appl. No. 16/836,049 dated Nov. 10, 2020.

\* cited by examiner

US 10,903,740 B2

CHARGE PUMP SYSTEMS, DEVICES, AND METHODS

CROSS-REFERENCE TO RELATED APPLICATIONS

The present application claims priority to U.S. patent application Ser. No. 15/983,123, filed May 18, 2018, which was a continuation of and claims priority to PCT Application No. PCT/US2018/00070, filed Feb. 16, 2018, which claims priority to U.S. Provisional Patent Application Ser. No. 62/460,003, filed Feb. 16, 2017, the disclosure of which is incorporated herein by reference in its entirety.

TECHNICAL FIELD

The subject matter disclosed herein relates generally to charge pumps. More particularly, the subject matter disclosed herein relates to configurations and operation of charge pumps used to charge a capacitor to a relatively higher potential than a voltage supply.

BACKGROUND

Charge pumps are used to generate a desired high voltage output in configurations where the supply voltage is comparatively low. Even where such a high-voltage output would be advantageous, however, various issues associated with charge pumps have prevented them from replacing other high voltage sources. For example, parasitics to ground, space required for charge pump elements (e.g., pump stages, control circuits, hold capacitor), and time to charge can all be seen as detrimental to certain circuits. For many of these reasons, the applicability of charge pumps has been limited despite the ability to generate a high voltage output from a comparatively low supply voltage.

SUMMARY

In accordance with this disclosure, charge pump devices, systems, and methods are provided. In one aspect, a charge pump is provided in which a first plurality of series-connected charge-pump stages is connected between a supply voltage node and a first circuit node, wherein the first plurality of charge-pump stages are operable to produce a first electrical charge at the first circuit node, the first electrical charge having a first polarity; and a second plurality of series-connected charge-pump stages is connected between the supply voltage node and a second circuit node, wherein the second plurality of charge-pump stages are operable to produce a second electrical charge at the second circuit node, the second electrical charge having a second polarity.

In another aspect, a method for regulating charge in a circuit includes selectively activating a first plurality of series-connected charge-pump stages connected between a supply voltage node and a first circuit node to drive charge between stages of the first plurality of series-connected charge-pump stages, wherein the first plurality of charge-pump stages are operable to produce a first electrical charge at the first circuit node, the first electrical charge having a first polarity; and selectively activating a second plurality of series-connected charge-pump stages connected between the supply voltage node and a second circuit node to drive charge between stages of the second plurality of series-connected charge-pump stages, wherein the second plurality of charge-pump stages are operable to produce a second electrical charge at the second circuit node, the second electrical charge having a second polarity.

In another aspect, a micro-electro-mechanical systems (MEMS) device includes at least one fixed electrode, a first plurality of series-connected charge-pump stages connected between a supply voltage node and the at least one fixed electrode, a movable beam including at least one movable electrode that is spaced apart from the at least one fixed electrode, and a second plurality of series-connected charge-pump stages connected between the supply voltage node and the at least one movable electrode. In this configuration, the first plurality of series-connected charge-pump stages and the second plurality of series-connected charge-pump stages are selectively operable to generate a desired electrostatic force between the at least one fixed electrode and the at least one movable electrode.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Figure 1:
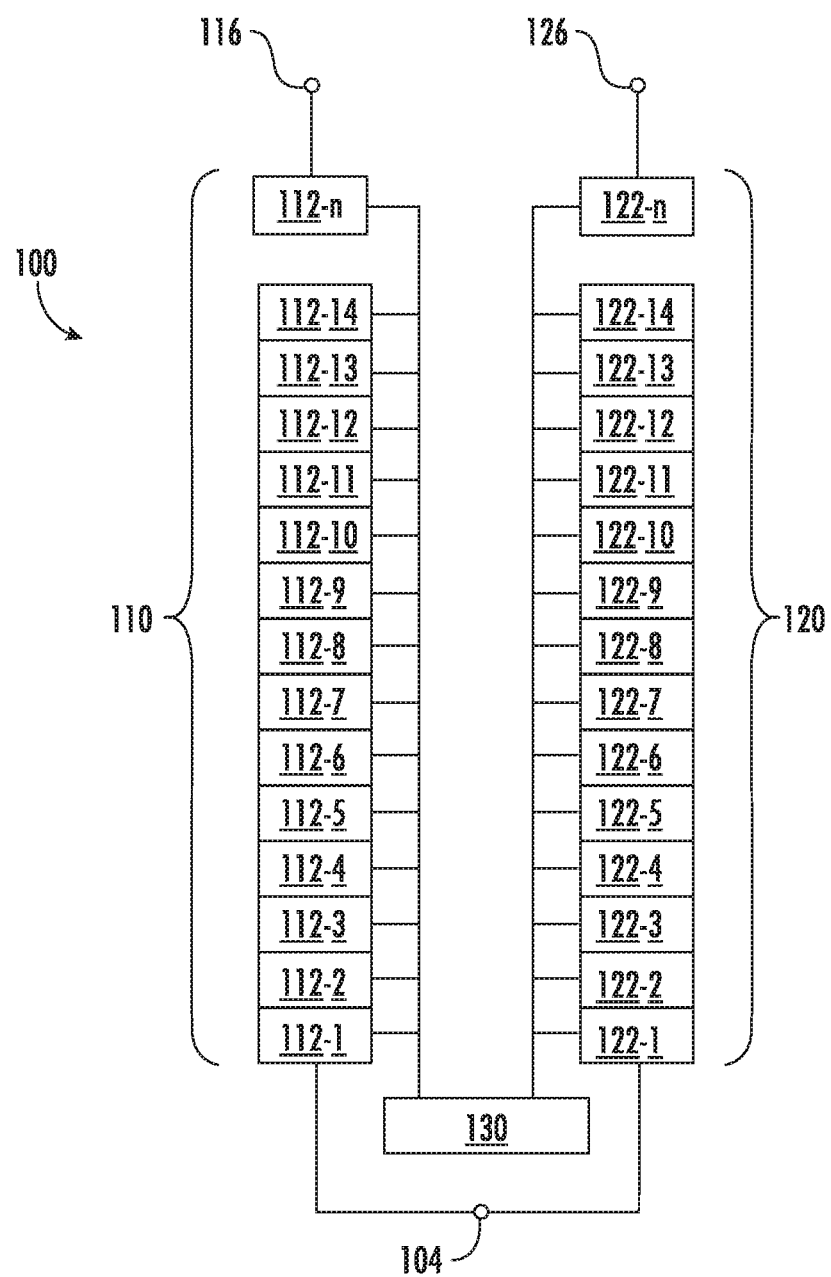
FIG. 1 is a schematic representation of a charge pump system according to an embodiment of the presently disclosed subject matter.

The present subject matter provides charge pump systems, devices, and methods. In one aspect, the present subject matter provides a charge pump that includes two independently-controlled charge pump sections. Referring to an embodiment illustrated in FIG. 1, for example, a charge pump system, generally designated 100, can include a first charge pump, generally designated 110, that includes a first plurality of series-connected charge-pump stages 112-1 through 112-$n$ connected between a supply voltage node 104 and a first circuit node 116. First plurality of charge-pump stages 112-1 through 112-$n$ is operable to produce a first electrical charge at first circuit node 116. In addition, charge pump system 100 further includes a second charge pump, generally designated 120, which includes a second plurality of series-connected charge-pump stages 122-1 through 122-n connected between supply voltage node 104 and a second circuit node 126. Second plurality of charge-pump stages 122-1 through 122-n is operable to produce a second electrical charge at second circuit node 126.

In some embodiments, for example, each of first charge pump 110 and second charge pump 120 can be any of a variety of charge pump designs known in the art (e.g., a Dickson-type charge pump, a cross-coupled switched capacitor circuit). In any arrangement, charge is passed between the stages of each of first charge pump 110 and second charge pump 120 by a two-phase clock such that it can only flow one way, and the charge builds up at the end of the strings at first and second circuit nodes 116 and 126. The number of stages can be selected to generate the amount of voltage step-up desired from each of first and second charge pumps 110 and 120. For instance, the number of stages can be selected based on the difference between the desired high voltage output at first circuit node 116 and the charge pump's voltage supply at supply voltage node 104. The number of stages is thereby generally fixed for any given application.

For example, one configuration for a charge pump design can include an even number of stages, half of which are clocked high on each rising clock edge and the other half are clocked high on the falling clock edge. In some embodiments, charge pump system 100 includes a single clock driver circuit 130 in communication with both of the first plurality of series-connected charge-pump stages 112-1 through 112-n and the second plurality of series-connected charge-pump stages 122-1 through 122-n. In such a configuration, clock driver circuit 130 is configured to selectively drive charge through one or both of the first plurality of series-connected charge-pump stages 112-1 through 112-n to supply the first electrical charge to first circuit node 116 and/or the second plurality of series-connected charge-pump stages 122-1 through 122-n to supply the second electrical charge to second circuit node 126.

Although one example of a configuration of charge pump system 100 is discussed here, those having ordinary skill in the art will recognize that charge pump system 100 can be provided in any of a variety of other configurations in which charge is driven between stages of first and second charge pumps 110 and 120.

In some embodiments, charge pump system 100 according to the present disclosure can be implemented using silicon-on-insulator (SOI) manufacturing methods. With this configuration, the operation of charge pump system 100 can be more efficient due to lower parasitics to ground compared to other technologies. In addition, this configuration can minimize the parasitic capacitances with minimum size transistors and not having the body tied to a substrate, resulting in charge pump system 100 being comparatively efficient and small with small value coupling capacitors, and control that is more complex can be enabled compared to simple diode-connected FETs. In addition, a large depletion region would not be required for substrate isolation.

Figure 2:
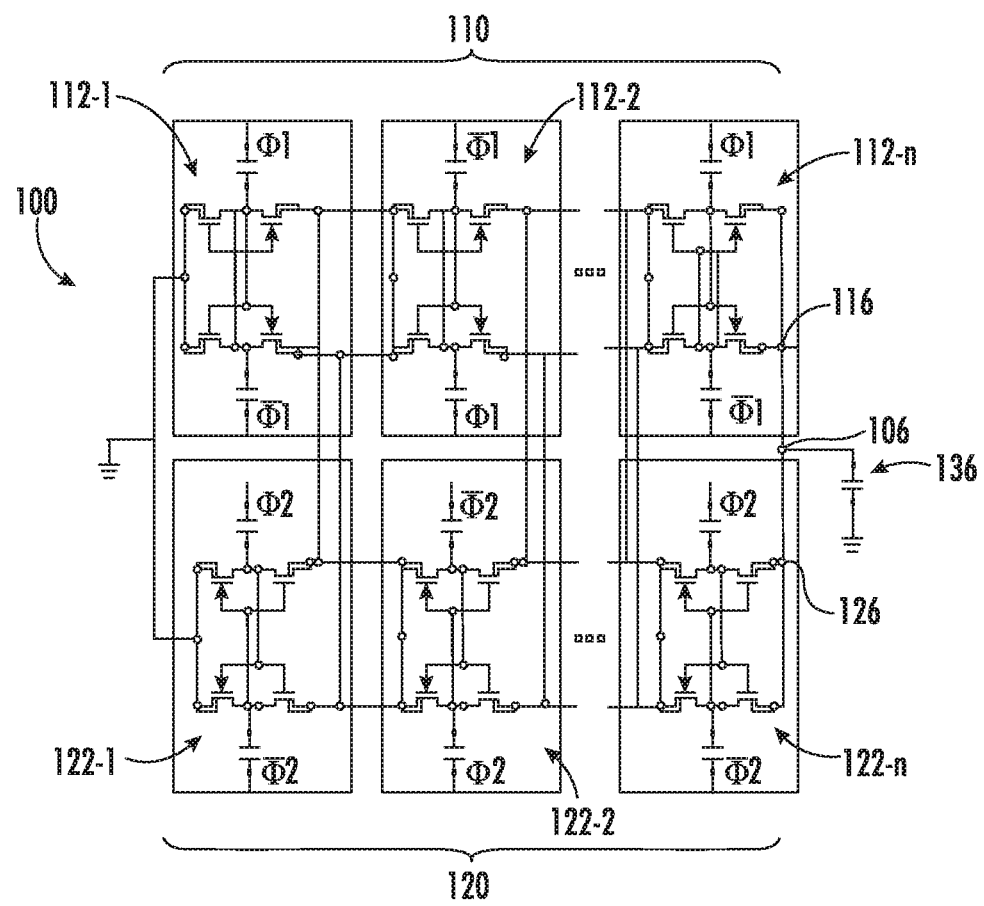
FIG. 2 is a circuit diagram of a charge pump system according to an embodiment of the presently disclosed subject matter.

Regardless of the particular configuration of charge pump system 100, by designing the configurations of each of first and second charge pumps 110 and 120 and their connections to supply voltage node 104 and/or to clock driver circuit 130, charge pump system 100 can be adapted for a variety of applications. First, for example, as illustrated in FIG. 2, first charge pump 110 can be configured to receive a set of first voltage inputs $\Phi_1$ and $\overline{\Phi_1}$ (alternating inputs of a two-phase clock signal from clock driver circuit 130) such that the first electrical charge produced at first circuit node 116 has a first polarity (e.g., a positive polarity). Second charge pump 120 can be configured to receive a set of second voltage inputs $\Phi_2$ and $\overline{\Phi_2}$ such that the second electrical charge produced at second circuit node 126 has a second polarity (e.g., a negative polarity) that is opposite the first polarity.

In addition, as illustrated in FIG. 2, in some embodiments, first circuit node 116 and second circuit node 126 are connected to a common output node 106. In some embodiments, output node 106 can be connected to a capacitor 136 or other component for which it is desired for the electrical charge to be regulated. In this configuration, first charge pump 110 and second charge pump 120 are operable antagonistically to selectively provide opposing charges to output node 106 and to capacitor 136. Accordingly, in some situations, charge pump system 100 can be operated by activating the first plurality of series-connected charge-pump stages 112-1 through 112-n and deactivating the second plurality of series-connected charge-pump stages 122-1 through 122-n such that only the positive high-voltage charge produced by first charge pump 110 is provided to output node 106. In this way, charge pump system 100 can produce a high voltage output at output node 106. Alternatively, both of the first plurality of series-connected charge-pump stages 112-1 through 112-n and the second plurality of series-connected charge-pump stages 122-1 through 122-n can be activated such that the first and second electrical charges produced by first and second charge pumps 110 and 120, respectively, substantially offset one another (e.g., to produce substantially zero charge at output node 106).

Figure 3:
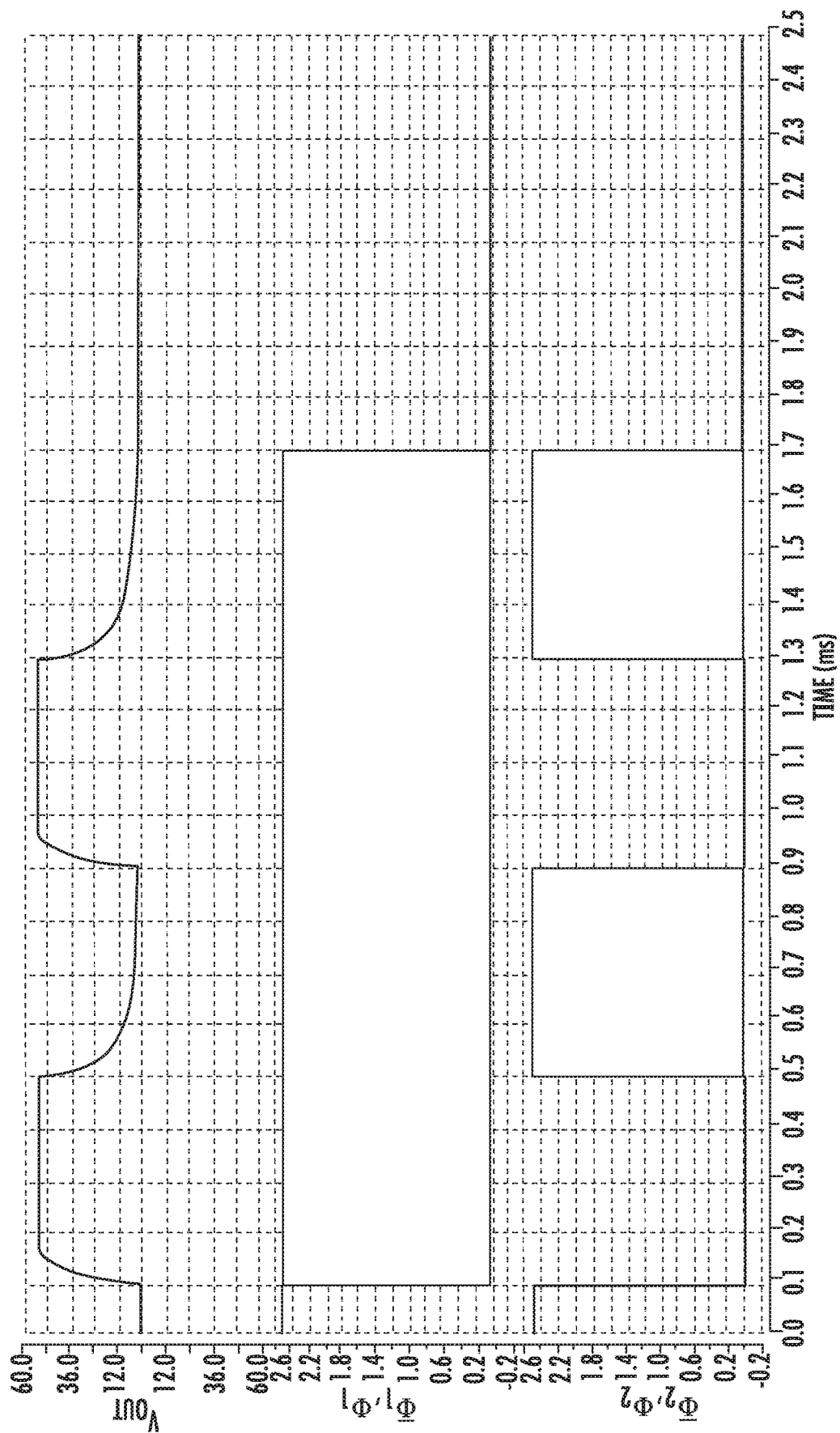
FIG. 3 is a series of graphs illustrating the output voltage of a charge pump system depending on the operating state of multiple charge pump elements according to an embodiment of the presently disclosed subject matter.

Referring to FIG. 3, for example, an electrical potential at output node 106 (top graph of FIG. 3) can be controlled through the selective activation of first charge pump 110 (e.g., by changing the value of first voltage inputs $\Phi_1$ and $\overline{\Phi_1}$ as shown in the middle graph of FIG. 3) and second charge pump 120 (e.g., by changing the value of second voltage inputs $\Phi_2$ and $\overline{\Phi_2}$ as shown in the bottom graph of FIG. 3). In particular, as illustrated in FIG. 3, where first charge pump 110 is operated alone, a positive high-voltage charge is developed at output node 106. To reduce the charge at output node 106 back to ground level, second charge pump 120 can be operated, effectively offsetting the positive charge provided by first charge pump 110. In the embodiment illustrated in FIG. 3, this offsetting can be performed with both of first and second charge pumps 110 and 120 operating. Alternatively, first charge pump 110 can be turned off, and second charge pump 120 can be turned on alone to reduce the charge at output node 106 even faster.

Figure 4:
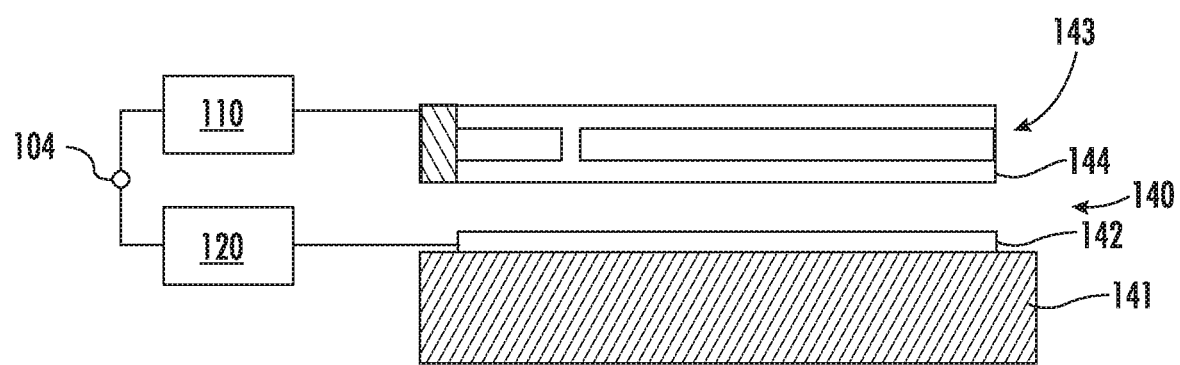
FIG. 4 is a schematic of a charge pump system configured to drive a micro-electro-mechanical systems (MEMS) device according to an embodiment of the presently disclosed subject matter.

Alternatively, in another configuration, charge pump system 100 can be used to provide differential control to the deflection of a micro-electro-mechanical systems (MEMS) device. As illustrated in FIG. 4, for example, in some embodiments, a MEMS device, generally designated 140, can include at least one fixed electrode 142 (e.g., which can be mounted on a substrate 141), and a movable beam 143 is suspended over fixed electrode 142, movable beam 143 including at least one movable electrode 144 that is spaced apart from fixed electrode 142 and is movable with respect to fixed electrode 142. Charge pump system 100 is connected to this structure, with first charge pump 110 being connected to one of movable electrode 124 or fixed electrode 122, and second charge pump 120 being connected to the other of fixed electrode 142 or movable electrode 144. In this configuration, first and second charge pumps 110 and 120 can be selectively operable to generate a desired electrostatic force between the at least one fixed electrode 142 and at least one movable electrode 144.

Figure 5:
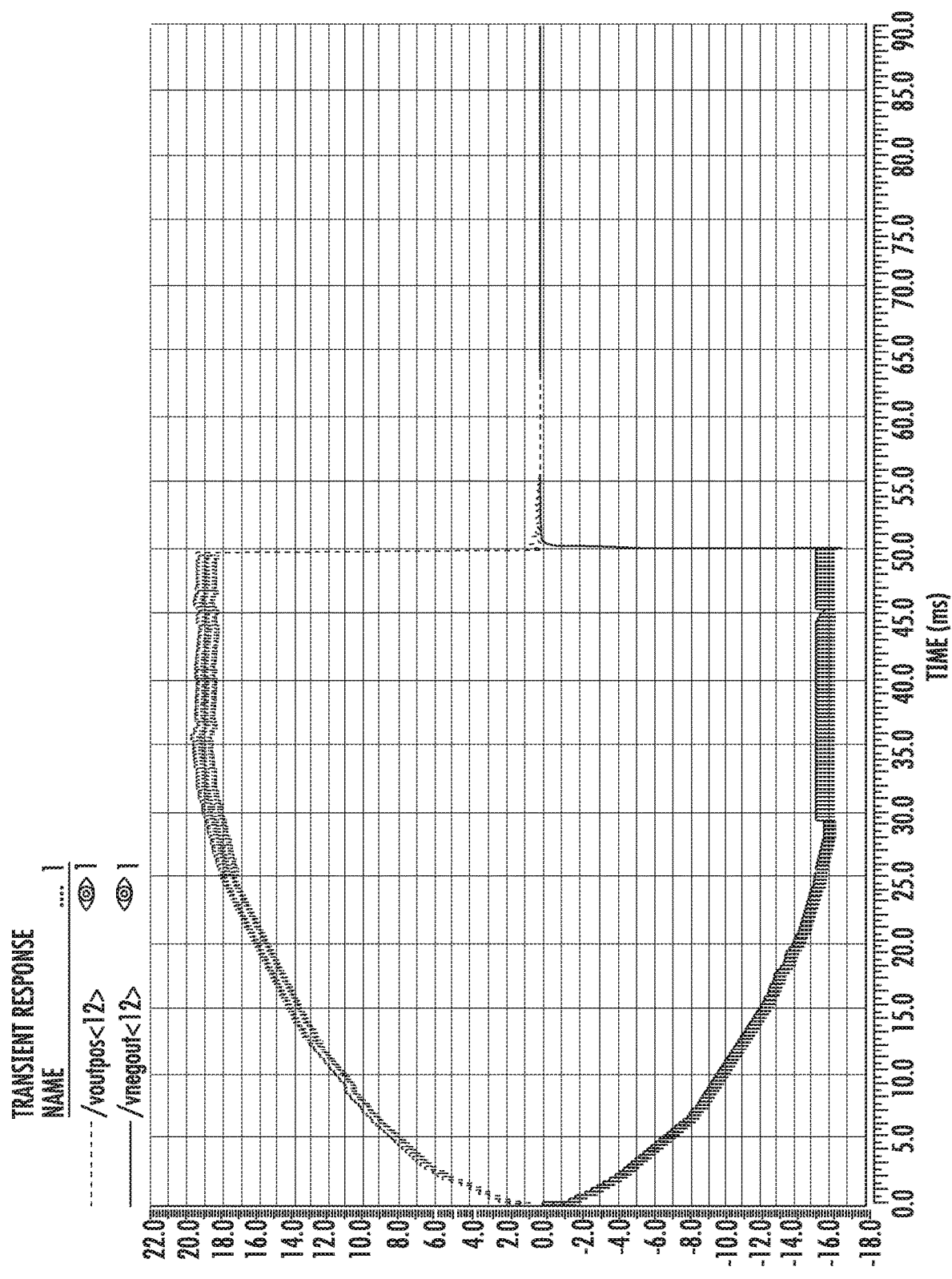
FIG. 5 is a graph illustrating differential drive waveforms of a charge pump system according to an embodiment of the presently disclosed subject matter.

For example, in some embodiments in which first charge pump 110 produces a first charge having a first polarity and second charge pump 120 produces a second charge having a second polarity that is opposite the first polarity, the operation of charge pump system 100 causes movable beam 143 to deflect toward fixed electrode 142 when both of first charge pump 110 and second charge pump 120 activated. In this way, differential control of each electrode of MEMS device 140 lowers the voltage requirement from ground by using first and second charge pumps 110 and 120 to generate both positive and negative voltages. Stated otherwise, as illustrated in FIG. 5, far higher voltages can be achieved and controlled in this manner since, by providing charges of opposing polarities to each electrode, the total potential difference is effectively double the magnitude of the voltage from ground. Such a system is only limited by the length of each charge pump string and the capacitor dielectric breakdowns. In addition, this arrangement can greatly reduce the breakdown requirement for the charge pump capacitors and likely enable the use of much smaller pumps.

Alternatively, in some embodiments in which the first polarity is the same as the second polarity, the operation of charge pump system 100 can produce a repulsive force between fixed electrode 142 and movable electrode 144. As a result, movable beam 143 can be driven away from fixed electrode 142 (e.g., to overcome stiction).

Regardless of the particular configuration, the deflection of movable beam 143 can be driven directly by charge pump system 100. Thus, whereas conventional MEMS actuators generally require high voltage transistors to apply and remove the high-voltage from such MEMS devices, in some embodiments of MEMS device 140, no high-voltage transistors are needed (e.g., for an SOI implementation). Furthermore, since charge pump system 100 is charging the MEMS itself (i.e., rather than a separate hold capacitor), only a relatively low charge needs to be provided (e.g., only about 1 pF of charge). As a result, each of first and second charge pumps 110 and 120 can be very small, which is further helpful to avoid large steps due to the small load. In addition, since charge pump system 100 can be implemented using SOI or other similar processes, first and second charge pumps 110 and 120 can be positioned directly above, below, or next to the MEMS device with which they are associated, such as in a single monolithic semiconductor die, thereby forming a compact and efficient solution.

In addition, driving one or more such MEMS beams directly with charge pump system 100 controls the deflection of movable beam 143 with charge rather than voltage. Thus, in contrast to conventional MEMS actuators, there will not be a pull-in but a progressive closure as charge is added and a progressive release as charge is removed. Although the time to charge may be greater in some embodiments as a result, such progressive closure can minimize ringing, which can result in a shorter total time to stable closure (e.g., compared to total time for snap-down plus time for ringing to subside). In addition, impact forces will be greatly reduced, avoiding fracturing and leading to far lower wear.

In any configuration or application, the operation of charge pump system 100 can include any of a variety of control and regulation systems. In some embodiments, a regulation system for charge pump system 100 is provided in order to sense the available high voltage output at one or more of first circuit node 116, second circuit node 126, and/or output node 106 to determine when either or both of first charge pump 110 or second charge pump 120 should be activated. The regulation system for the charge pump can be configured to determine the number of cycles that the charge pump is clocked as well as a voltage increment required at each stage of the charge pump. The number of cycles that the charge pump is clocked is determined by one or more of the design of the charge pump, load capacitance, or the voltage increment required at each stage of the charge pump to achieve the desired high voltage output.

In some embodiments, the threshold level for starting the clock and the number of clock cycles are set to enable stability in control of the charge pump. In that case, the regulation system can be combined with a fractional drive to throttle the charge pump as well as manage any voltage spikes. This would require more cycles for a given voltage rise, but give finer control of the charge pump stages. Additionally, it may take longer for the string to stabilize after the clock cycles stop and the initial states of the charge pump may be uneven along the string.

The voltage increment can be determined from a measurement comparison to a desired threshold voltage or reference voltage. Additionally, the number of cycles needed to achieve the desired high voltage output can be computed based on the difference between the measured and reference voltages. Alternatively, the measurement of a voltage at or below the threshold voltage can act as a trigger for a fixed number of operating cycles to be initiated. In some embodiments, the measurement taken to make the comparison can be taken on the charge pump diode string itself when the charge pump is not active. In this way, a separate voltage divider is not necessary, which can be advantageous since the use of a voltage divider would add a comparatively large amount of leakage to the charge pump, requiring the charge pump to be operated more often to maintain the desired high voltage output at the primary circuit node. In particular, since charge pump system 100 disclosed herein can involve the dual, independent regulation of first and second charge pumps 110 and 120, this benefit of eliminating the need for separate divider strings can be especially advantageous.

Figure 6:
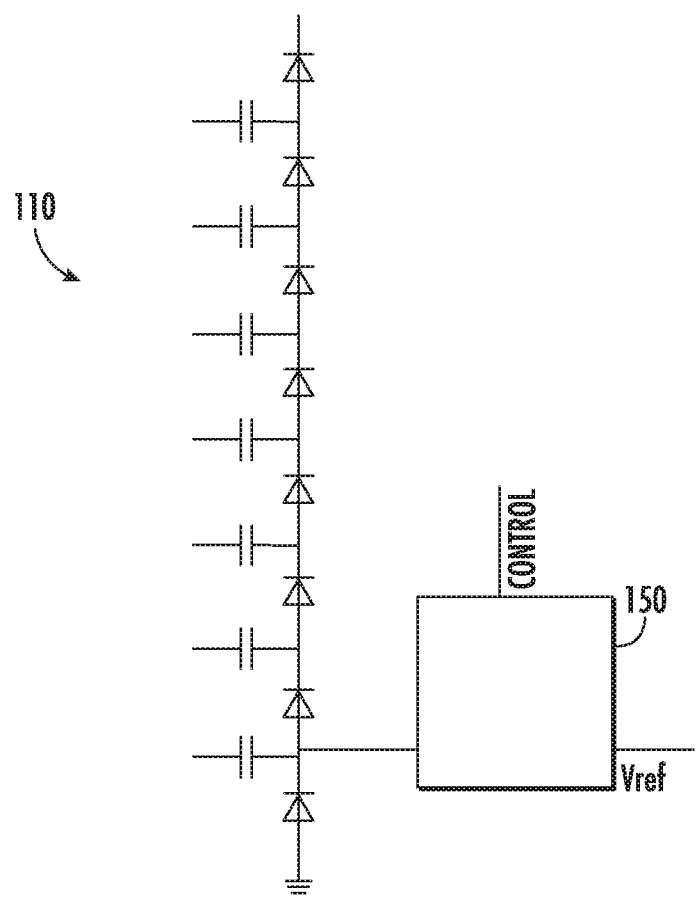
FIG. 6 is a schematic representation of a charge pump control system according to an embodiment of the presently disclosed subject matter.

Referring to one configuration for a regulation system, FIG. 6 illustrates a regulation system 150 that is configured to take a voltage measurement for first charge pump 110. In the illustrated configuration, this measurement can be taken near the bottom of the string of first charge pump stages 112-1 through 112-n, which provides regulation system 150 with a low voltage that is in direct proportion to the high voltage at the top of the string. Regulation system 150 is further configured to extrapolate the present voltage at first circuit node 116 from the voltage measurement taken at the bottom of the string. In particular, in embodiments in which charge pump system 100 is implemented using SOI processes or other insulated substrate transistor technologies, the voltage division can be more uniform among first charge pump stages 112-1 through 112-n than in other implementations (e.g., CMOS), and thus the measurement taken by regulation system 150 can be used to determine the voltage at first circuit node 116. The system extrapolates the present voltage by finding the difference between the reference voltage and the measured voltage corresponding to the desired high voltage output at first circuit node 116. Regulation system 150 then uses this information to calculate the number of clock cycles that first charge pump 110 needs to be activated in order to achieve the desired voltage level at first circuit node 116. A similar structure can be provided in communication with second charge pump 120 for regulating the charge at second circuit node 126.

In some embodiments, such a measurement on the diode string can be obtained by a high impedance input to avoid disturbing the voltage division. By avoiding the separate measurement divider, current consumption should be greatly reduced. Furthermore, a direct measurement on the charge pumps will provide nearly instantaneous voltage measurement and therefore allow for tighter, more precise regulation of the charge pump, as well as a lower ripple during a static "on" state. By not requiring a separate divider string, it will greatly decrease the leakage from the primary circuit node, leading to lower DC current consumption and lower average noise.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A charge pump comprising:
  a first plurality of series-connected charge-pump stages connected between a supply voltage node and a first circuit node, wherein the first plurality of charge-pump stages are operable to produce a first electrical charge at the first circuit node;
  a second plurality of series-connected charge-pump stages connected between the supply voltage node and a second circuit node, wherein the second plurality of charge-pump stages are operable to produce a second electrical charge at the second circuit node;
  wherein the first circuit node and the second circuit node are connected to a common output node.

2. The charge pump of claim 1, wherein each of the charge-pump stages comprises a silicon-on-insulator (SOI) device.

3. The charge pump of claim 1, comprising a single clock driver circuit in communication with both of the first plurality of series-connected charge-pump stages and the second plurality of series-connected charge-pump stages, wherein the single clock driver circuit is configured to selectively drive charge through one or both of the first plurality of series-connected charge-pump stages and the second plurality of series-connected charge-pump stages to supply one or both of the first electrical charge or the second electrical charge at the common output node.

4. The charge pump of claim 1, wherein the first plurality of series-connected charge-pump stages is configured to generate the first electrical charge having a first polarity;
  wherein the second plurality of series-connected charge-pump stages is configured to generate the second electrical charge having a second polarity that is equivalent to the first polarity; and
  wherein the first plurality of series-connected charge-pump stages and the second plurality of series-connected charge-pump stages are selectively operable to regulate a total electrical charge at the common output node.

5. The charge pump of claim 1, wherein the first plurality of series-connected charge-pump stages is configured to generate the first electrical charge having a first polarity; and
  wherein the second plurality of series-connected charge-pump stages is configured to generate the second electrical charge having a second polarity that is opposite the first polarity;
  wherein the first plurality of series-connected charge-pump stages and the second plurality of series-connected charge-pump stages are selectively operable to regulate a total electrical charge at the common output node.

6. The charge pump of claim 1, comprising one or more voltage measurement devices configured to measure a present charge state at either or both of the first circuit node or the second circuit node;
  wherein the one or more voltage measurement devices is connected in communication with one of the plurality of charge-pump stages of either or both of the first plurality of charge-pump stages or the second plurality of charge-pump stages, and
  wherein the voltage measurement device is configured to extrapolate the present charge state at either or both of the first circuit node or the second circuit node from a voltage measurement taken at the one of the plurality of charge-pump stages.

7. A method for regulating charge in a circuit, the method comprising:
  selectively activating a first plurality of series-connected charge-pump stages connected between a supply voltage node and a first circuit node to drive charge between stages of the first plurality of series-connected charge-pump stages, wherein the first plurality of charge-pump stages are operable to produce a first electrical charge at the first circuit node; and
  selectively activating a second plurality of series-connected charge-pump stages connected between the supply voltage node and a second circuit node to drive charge between stages of the second plurality of series-connected charge-pump stages, wherein the second plurality of charge-pump stages are operable to produce a second electrical charge at the second circuit node.

8. The method of claim 7, wherein the first circuit node and the second circuit node are connected to a common output node.

9. The method of claim 8, wherein selectively activating the first plurality of series-connected charge-pump stages and selectively activating the second plurality of series-connected charge-pump stages comprises activating the first plurality of series-connected charge-pump stages and deactivating the second plurality of series-connected charge-pump stages to produce a high voltage output at the common output node.

10. The method of claim 8, wherein selectively activating the first plurality of series-connected charge-pump stages and selectively activating the second plurality of series-connected charge-pump stages comprises activating both of the first plurality of series-connected charge-pump stages and the second plurality of series-connected charge-pump stages to produce substantially zero charge at the primary circuit node.

11. The method of claim 7, wherein one or both of selectively activating the first plurality of series-connected charge-pump stages or selectively activating the second plurality of series-connected charge-pump stages comprises:
  measuring a present charge state at one or both of the first circuit node or the second circuit node by extrapolating the present charge state from a voltage measurement taken at a respective one of the first plurality of charge-pump stages or the second plurality of charge-pump stages; and
  activating the first plurality of series-connected charge-pump stages driving charge or the second plurality of series-connected charge-pump stages if the present charge state is different than a desired charge state.

12. A micro-electro-mechanical systems (MEMS) device comprising:
- at least one fixed electrode;
- a first plurality of series-connected charge-pump stages connected between a supply voltage node and the at least one fixed electrode;
- a movable beam including at least one movable electrode that is spaced apart from the at least one fixed electrode; and
- a second plurality of series-connected charge-pump stages connected between the supply voltage node and the at least one movable electrode;
- wherein the first plurality of series-connected charge-pump stages and the second plurality of series-connected charge-pump stages are selectively operable to generate a desired electrostatic force between the at least one fixed electrode and the at least one movable electrode.

13. The micro-electro-mechanical systems (MEMS) device of claim 12, wherein each of the charge-pump stages comprises a silicon-on-insulator (SOI) device.

14. The micro-electro-mechanical systems (MEMS) device of claim 12, wherein the first plurality of charge-pump stages is operable, when activated, to produce a first electrical charge at the at least one fixed electrode;
- wherein the second plurality of charge-pump stages is operable, when activated, to produce a second electrical charge at the at least one movable electrode; and
- wherein the movable beam is movable toward the at least one fixed electrode where both the first plurality of charge-pump stages and the second plurality of charge-pump stages are activated.

15. The micro-electro-mechanical systems (MEMS) device of claim 12, wherein the first plurality of charge-pump stages are operable, when activated, to produce a first electrical charge at the at least one fixed electrode;
- wherein the second plurality of charge-pump stages are operable, when activated, to produce a second electrical charge at the at least one movable electrode; and
- wherein a repulsive force is generated between the at least one fixed electrode and the at least one movable electrode.

16. The micro-electro-mechanical systems (MEMS) device of claim 12, wherein the plurality of charge-pump stages are positioned substantially beneath the movable beam.

* * * * *